United States Patent [19]

Botti et al.

[11] Patent Number: 5,068,620
[45] Date of Patent: Nov. 26, 1991

[54] CIRCUIT FOR SECURING OUTPUT DISTORTION, IN PARTICULAR OF FINAL STAGES OF AUDIO DEVICES

[75] Inventors: Edoardo Botti, Vigevano; Fabrizio Stefani, Cardano Al Campo; Daniela Nebuloni, Bareggio, all of Italy

[73] Assignee: SGS-Thomson Mocroelectronics S.r.l., Agrate Brianza, Italy

[21] Appl. No.: 607,949

[22] Filed: Nov. 1, 1990

[30] Foreign Application Priority Data

Nov. 8, 1989 [IT] Italy ............................... 22306 A/89

[51] Int. Cl.⁵ ............................................. G01R 19/00
[52] U.S. Cl. ....................................................... 330/2
[58] Field of Search .................... 330/2, 136, 144, 145, 330/149, 284

[56] References Cited

U.S. PATENT DOCUMENTS 4,048,573 9/1977 Evans et al. ............................. 330/2

Primary Examiner—James B. Mullins
Attorney, Agent, or Firm—Guido Modiano; Albert Josif

[57] ABSTRACT

A circuit for sensing the output distortion of amplifier stages of the type which has a first input which receives a voltage signal to be amplified, a second input connected to a feedback network and an output which generates an amplified output signal. The circuit comprises at least one comparator, which receives in input a first signal which is correlated to the voltage signal and a second signal which is correlated to the output signal of the amplifier stage, and is enabled so as to generate a distortion signal in output when the second signal exceeds the first one in terms of absolute value, i.e. in the presence of distortion.

4 Claims, 3 Drawing Sheets

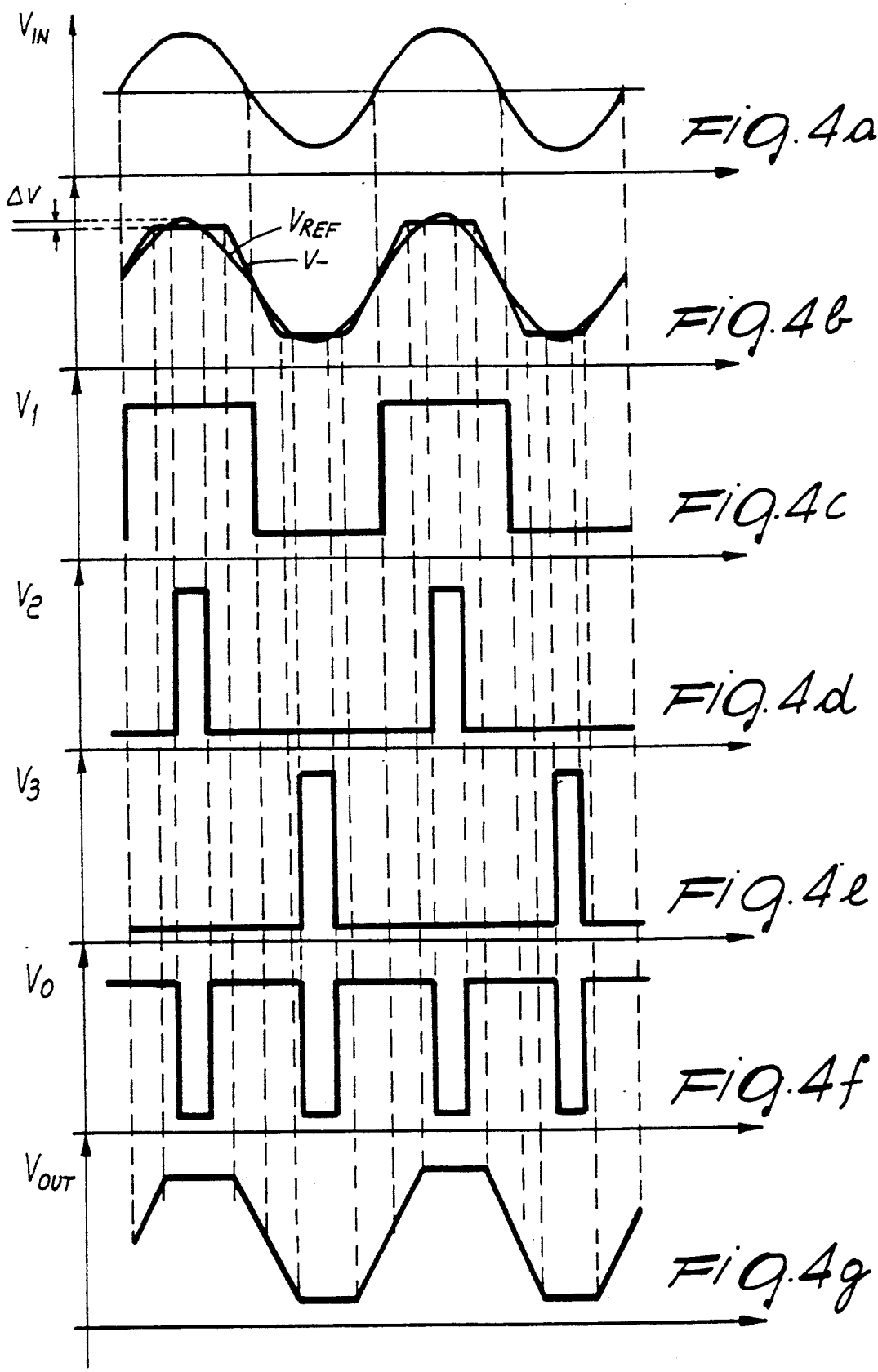

CIRCUIT FOR SECURING OUTPUT DISTORTION, IN PARTICULAR OF FINAL STAGES OF AUDIO DEVICES

BACKGROUND OF THE INVENTION

The present invention relates to a circuit for sensing output distortion, in particular of final stages of audio devices.

As is known, an audio device can be compared to an operational amplifier which is fedback with a final stage such as the one shown schematically in FIG. 1. As can be seen, the final stage 3 can be represented by an audio amplifier 1 which drives a pair of transistors $Q_1$, $Q_2$ which are connected between the two power supply lines at $+V_{CC}$ and $-V_{CC}$ and define, between them, the output OUT of the audio device, to which the load, represented herein by a loudspeaker 2, is connected. The feedback circuit is constituted by a pair of resistors $R_1$, $R_2$; specifically, the resistor $R_1$ is connected between the inverting input of the amplifier 1 and the ground and the resistor $R_2$ is connected between said inverting input and the output OUT; the input signal $V_{IN}$ is applied to the non-inverting input of the amplifier.

In the final stage shown in FIG. 1, the maximum swing of the output, which is theoretically limited by the difference between the positive supply voltage and the negative one ($2 V_{CC}$) is actually given by $$\Delta V_{OUT} = 2V_{CC} - V_{CEQ1,sat} - V_{CEQ2,sat}.$$

When the input signal $V_{IN}$ exceeds a certain dynamic range equal to $$V_{IN} > V_{OUT} \cdot \frac{R_1}{R_1 + R_2}$$

the output is no longer able to follow the dynamics of the input signal in a linear manner, and distortion occurs (the so-called "clipping" phenomenon). Since said output signal drives a loudspeaker, in order to be heard with a still acceptable fidelity its distortion during the peaks of the input signal must not exceed a certain percentage, e.g. 10%; beyond this value the sound in fact becomes unpleasant.

In order to solve this problem it is possible to sense the existing distortion and drive an appropriate attenuation circuit which is connected upstream of the final stage so as to limit the input signal thereof.

A solution for sensing the distortion is known for example from the U.S. patent application Ser. No. 07/202,846 filed on June 6, 1988 in the name of the same Applicant, wherein sensors are provided which control the state of saturation of the final transistors. Though it adequately solves the problem in some cases, this solution is in any case not free from disadvantages, since the information related to a 5-10% distortion, obtained by integrating the output signal from the clipping sensor, is not immediately available due to the integration time constant; the solution is applicable only in amplifiers with a particular output stage and is sufficiently accurate only if the output waveform of the amplifier is symmetrically distorted.

Other known solutions consider the input or output voltage signal and compare it with a reference voltage. A solution in which the input signal is controlled is shown by way of example in FIG. 2, wherein the final stage 3, which has a feedback network $R_1$, $R_2$, drives a load $R_L$. The input voltage $V_{IN}$ is also supplied to the positive input of a comparator 4; a fixed reference voltage is provided on the negative input of said comparator, which generates an error voltage $V_O$ which is then used to drive an attenuator. These known solutions, however, are not satisfactory, since they do not take into account the power supply voltage and/or the maximum swing of the signal in output from the audio amplifier, which also depends on the type of load to which the latter is connected.

SUMMARY OF THE INVENTION

Given this situation, the aim of the present invention is to provide a circuit for sensing output distortion, in particular of final stages of audio devices, which is capable of solving the disadvantages of known sensing circuits.

Within the scope of this aim, a particular object of the present invention is to provide an output distortion sensing circuit which is very accurate and in particular is independent of the power supply voltage value, of the frequency (in the operating range of audio amplifiers) and of the maximum swing of the output signal.

An important object of the present invention is to provide a circuit of the indicated type which can be applied to audio amplifiers which have an output stage of any type.

Another object of the present invention is to provide a circuit of the indicated type which can immediately provide the distortion information without introducing delays.

Another object of the present invention is to provide a circuit of the indicated type which allows a selective sensing of the distortion of the two half-waves and in particular is capable of sensing non-symmetrical distortions of the output signal.

Still another object of the present invention is to provide a circuit of the indicated type which is highly flexible and in particular has sensing thresholds which can be adjusted according to the requirements.

Not least object of the present invention is to provide a distortion sensing circuit which is highly reliable and has a simple and easily integratable structure.

This aim, the objects mentioned and others which will become apparent hereinafter are achieved by a circuit for sensing output distortion, in particular of final stages of audio devices, as defined in the accompanying claims.

BRIEF DESCRIPTION OF THE DRAWINGS

The characteristics and advantages of the invention will become apparent from the description of two preferred embodiments, illustrated only by way of non-limitative example in the accompanying drawings, wherein:

FIGS. 4a-4g show some waveforms of appropriate signals obtained from the diagram of FIG. 3 in the presence of clipping;

FIGS. 1 and 2 are not described hereinafter; reference is made to the preceding description for said figures.

DESCRIPTION OF THE PREFERRED EMBODIMENTS

Figure 3:
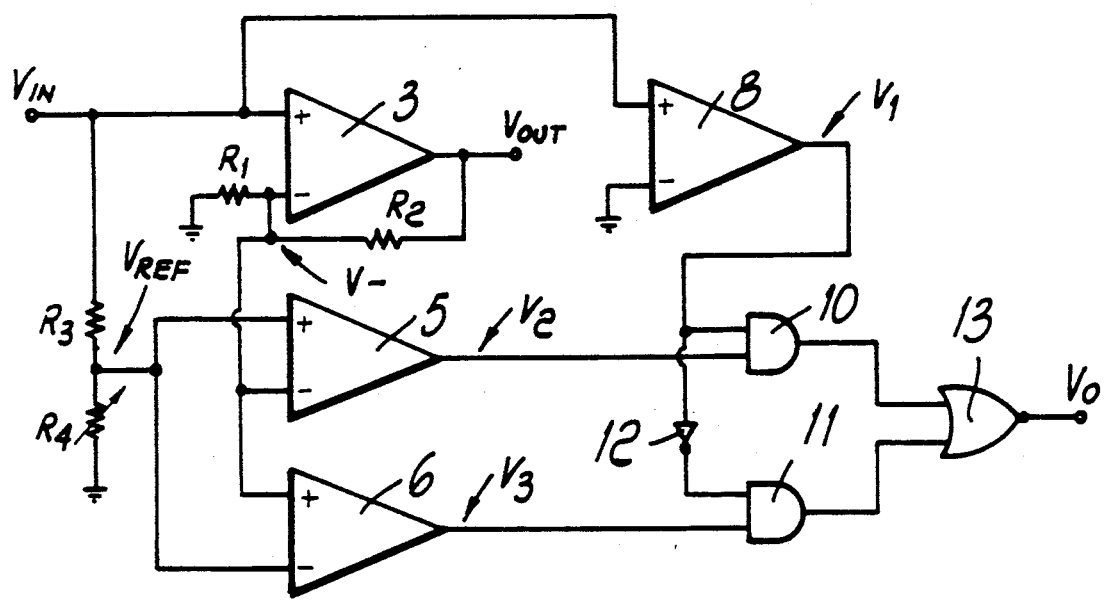
FIG. 3 is a block diagram of a possible embodiment of the circuit according to the invention.

With reference to FIG. 3, said figure illustrates a general diagram of a possible embodiment of an output distortion sensing circuit according to the invention, with the possibility of adjusting the percentage of distortion at which the intervention of the circuit is required and with selective sensing of the distortion on the two half-waves.

In said figure, the output stage has been again represented by a generic operational amplifier 3 which receives the input signal $V_{IN}$ on its non-inverting input and is fedback by the resistors $R_1$, $R_2$ provided between the output and the inverting input so as to generate, in output, the signal $V_{OUT}$ which is intended to drive a load which is not illustrated.

According to the invention, signals which are correlated both to the input and to the output of the stage 3 are fed to at least one comparator, which compares them so as to sense the imbalance of the stage and therefore the presence of clipping and so as to appropriately drive an attenuation circuit which is arranged upstream of the output stage 3, in order to appropriately attenuate the input signal fed thereto and keep distortion within preset values. In particular, the circuit intervenes at a preset distortion percentage which can be advantageously adjusted according to the requirements. The circuit shown in FIG. 3 can furthermore sense non-symmetrical distortions of the signal as well, since it is sensitive to distortion of the positive half-wave and of the negative half-wave.

The circuit therefore comprises a first comparator 5 and a second comparator 6 which receive in input the signals $V_{REF}$ and $V-$ which are taken respectively on a voltage divider, formed by resistors $R_3$, $R_4$ which are connected in series between the input of the stage and the ground, and on the intermediate point between $R_1$ and $R_2$. In detail, the voltage signal $V_{REF}$, which is correlated in a linear manner to the input signal $V_{IN}$ and defines an appropriate fraction thereof, is fed to the non-inverting terminal of the comparator 5 and to the inverting terminal of the comparator 6, whereas the voltage signal $V-$ is fed to the inverting terminal of the comparator 5 and to the non-inverting terminal of the comparator 6. The input voltage $V_{IN}$ is also supplied to the non-inverting input of a further comparator 8 the inverting terminal whereof is connected to the ground. The output of the comparator 8, which generates the voltage $V_1$, is supplied directly in input to a first logic product gate (AND gate) 10 and, after being appropriately inverted by means of an inverter 12, to a second logic product gate (AND gate) 11. The gates 10 and 11 furthermore respectively receive the output signals $V_2$ and $V_3$ which are generated by the comparators 5 and 6. The outputs of the gates 10 and 11 are fed to a negated logic sum gate (NOR gate) 13, which supplies in output a signal $V_0$ which is fed to an attenuator, not illustrated, which is capable of correspondingly attenuating the signal supplied in input to the output stage 3.

The circuit of FIG. 3 operates as follows (see also FIGS. 4a–4g and 5). In the absence of distortion, the output signal $V_{OUT}$, which is returned after being attenuated on the inverting input of the stage 3 by virtue of the feedback $R_1$, $R_2$, is equal to the input signal $V_{IN}$ which is present on the non-inverting input of said stage 3.

When the input voltage $V_{IN}$ becomes too high, the output, having reached its maximum dynamics, no longer follows the variation of the input in a linear manner and starts to distort. This distortion is also returned to the inverting input of the stage 3, so that the two inputs thereof are no longer equal but the non-inverting input is higher than the inverting one. This situation is clearly shown in FIG. 5, in which the voltages $V_{IN}$, $V-$ and $V_{REF}$ are shown. As can be seen, at a certain point $V-$ no longer follows the input signal $V_{IN}$, and a voltage difference equal to $\Delta V$ occurs at the voltage peak. Said voltage difference is a function of the distortion percentage, i.e. the more the THD (Total Harmonic Distortion) increases, the more $\Delta V$ increases.

The variable divider of FIG. 3 allows to set the distortion and the related $\Delta V$ at which intervention of the device is required. In detail, by acting on the resistive divider $R_3$, $R_4$ it is possible to adjust the amplitude of the signal $V_{REF}$, which represents the intervention threshold of the sensing circuit. In fact, as long as the voltage $V-$ remains higher than $V_{REF}$ (in terms of absolute value), the circuit does not intervene, whereas when the output $V_{OUT}$ reaches the set distortion, $V_{REF}$ and $V-$ are equal in amplitude. The comparison between said two signals consequently provides the information related to the existing distortion.

This comparison is performed by means of the comparators 5 and 6, each of which operates on a different half-wave. In particular, when the distortion of the positive half-wave exceeds the value set by means of $V_{REF}$, the latter becomes greater than $V-$ (FIG. 4b) and the output of the comparator 5 becomes high (FIG. 4d). The distortion on the negative half-wave is instead sensed by the comparator 6, the output whereof becomes high as soon as $V_{REF}$ becomes smaller than $V-$ (FIG. 4e). The comparator 8 has the function of allowing the correct obtainment of the information concerning the distortion of the output signal from the comparators 5 and 6 in the related half-wave. Since the inverting input of the comparator 8 is connected to the ground, said comparator, in fact, generates at its output the squared signal shown in FIG. 4c, which is positive in the positive half-wave and is used to alternatively enable one or the other of the gates 10, 11, whereas the gate 13 allows to combine the two items of information related to the distortion in the two individual half-waves into a single signal which has negative pulses when the distortion exceeds the set value.

Figure 1:
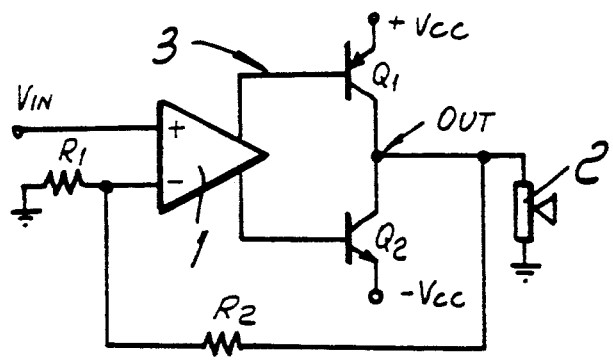
FIG. 1 is a general circuit diagram of a known final stage for audio applications.
Figure 2:
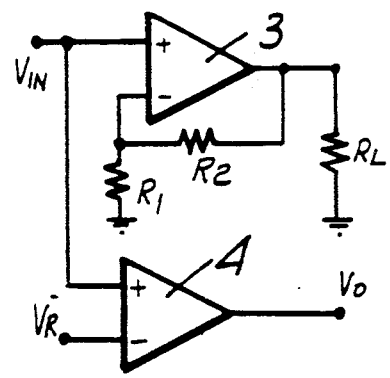
FIG. 2 is a general circuit diagram of a known distortion sensor.
Figure 5:
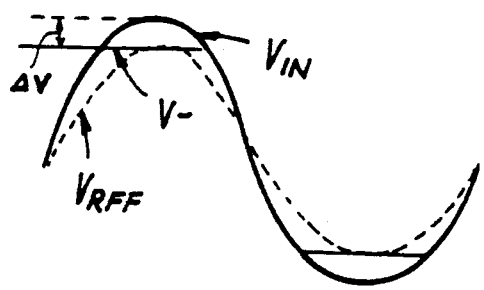
FIG. 5 shows the input signal, the output signal returned to the input by means of the feedback network of the audio amplifier and the reference signal which is correlated to the input signal for the diagram of FIG. 3 in the presence of clipping equal in value to the set distortion.
Figure 7:
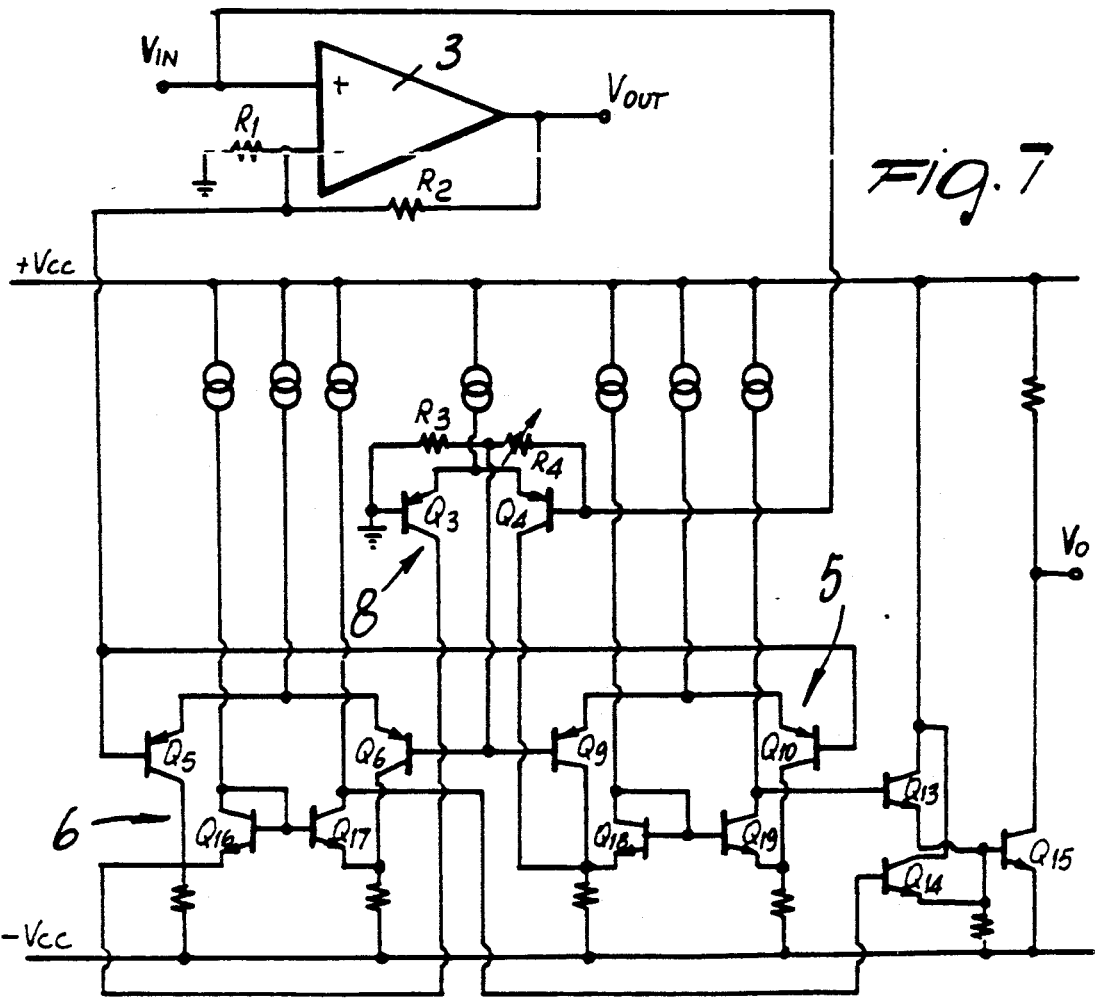
FIGS. 6 and 7 are two circuit diagrams related to two different practical embodiments of the block diagram of FIG. 3.
Figure 6:
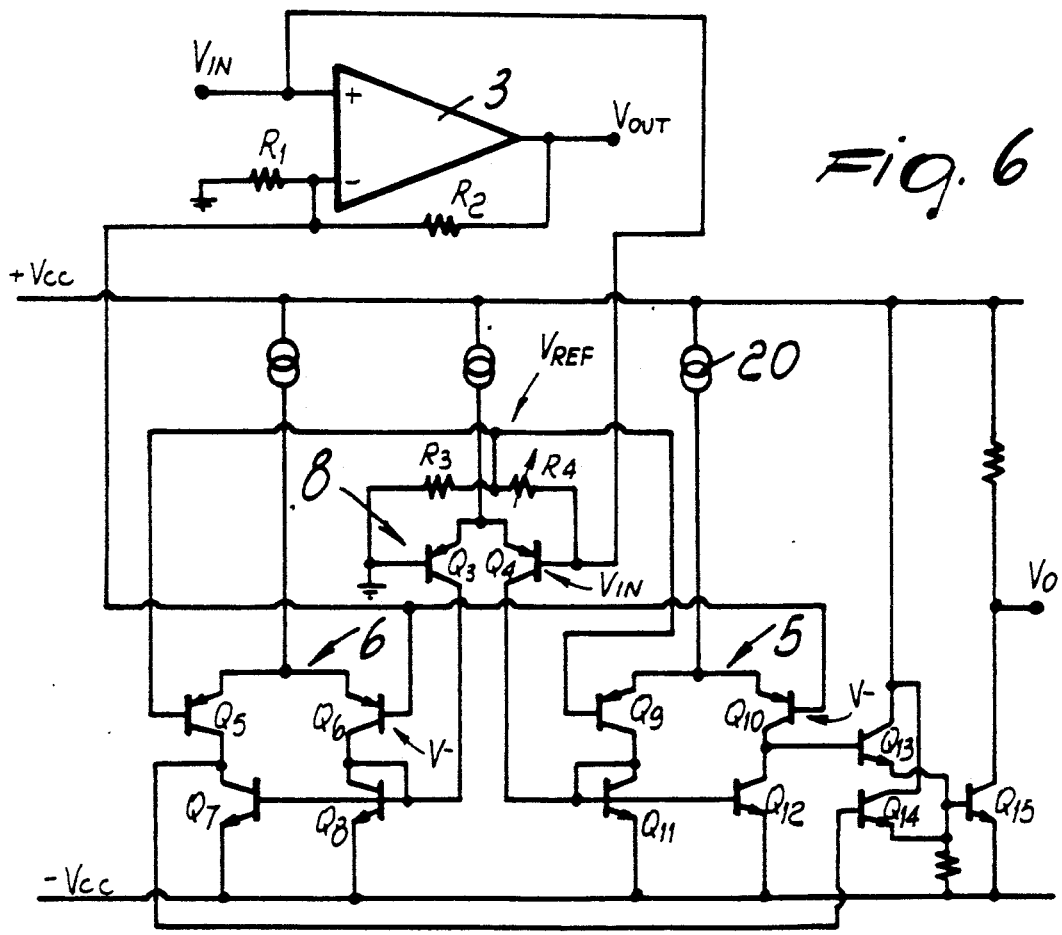

FIGS. 6 and 7 illustrate two circuit diagrams related to practical embodiments of the diagram of FIG. 3. In their common parts, the two diagrams of FIGS. 6 and 7 have been given the same reference numerals, and the blocks shown in FIG. 3 have been highlighted. As can be seen, the comparator 8 is constituted, in both embodiments, by a pair of transistors $Q_3$, $Q_4$ with coupled emitters, the bases whereof are respectively connected to the ground and to the non-inverting input of the stage 3 which receives the voltage $V_{IN}$. The comparators 5 and 6 are formed, in FIG. 6, by the transistors $Q_5$–$Q_8$ and respectively $Q_9$–$Q_{12}$ and, in FIG. 7, by the transistors $Q_5$, $Q_6$, $Q_{16}$, $Q_{17}$ and, respectively, $Q_9$, $Q_{10}$, $Q_{18}$, $Q_{19}$ (which also include the functions of the gates 10–12, with the operating difference explained hereinafter), whereas the transistors $Q_{13}$–$Q_{15}$ define the NOR gate 13.

The circuit of FIGS. 6 and 7 operate substantially as already explained with reference to FIG. 3, but with the following difference: the comparators 5 and 6 of FIG. 3 are always operating, while the comparator 8 has the function of enabling the passage of their information in output correspondingly to the half-wave of the input signal; in FIGS. 6 and 7, the comparators instead operate only if they are enabled by the comparator 8.

In detail, the operation of the circuit of FIG. 6 is as follows: during the positive half-wave, the comparator 8 ($Q_3$, $Q_4$) is unbalanced on $Q_3$; therefore $Q_4$ does not conduct and its collector current is nil. As long as the output $V_{OUT}$ does not exceed the set distortion, V− is higher than $V_{REF}$, and the differential $Q_9$, $Q_{10}$ is unbalanced on $Q_9$, which therefore conducts. Consequently, $Q_{11}$ and $Q_{12}$ are on (with $Q_{12}$ saturated with zero current) and $Q_{13}$ is off. During this half-wave, the transistors $Q_7$, $Q_8$ are kept on by means of $Q_3$, so that $Q_{14}$ is off and so is $Q_{15}$. The output $V_O$ is therefore high. Instead, when the output signal $V_{OUT}$ becomes a little higher than the set distortion, during the positive half-wave, V− is smaller than $V_{REF}$, so that the differential $Q_9$, $Q_{10}$ is unbalanced on $Q_{10}$, which is crossed by the current of the source 20. Consequently, $Q_{11}$ is off and its collector current is nil, and so is the current of $Q_{12}$, by virtue of the mirror connection between said two transistors. Therefore the collector of $Q_{10}$ goes high, switching on $Q_{13}$ and $Q_{14}$ and thus bringing the output $V_O$ to the low state. Operation is similar during the negative half-wave: the comparator 8 disables the comparator 5 and the comparator 6 drives the transistor $Q_{14}$, and therefore $Q_{15}$ is on or off depending on the presence or absence of distortion of the preset value.

The circuit of FIG. 7 operates similarly to what has been described for FIG. 6, with the difference that the circuit of FIG. 6 is not compatible with $-V_{CC}$, so that if the inputs of the comparators are connected to $-V_{CC}$ the circuit does not operate correctly, whereas the circuit of FIG. 7 is compatible with $-V_{CC}$ and therefore operates even in the condition in which the inputs are at $-V_{CC}$. The circuit of FIG. 7 is therefore more functional, although it is more complicated.

As can be seen from the above description, the invention fully achieves the proposed aim and objects. A sensing circuit has in fact been proposed which, by virtue of the sensing of the imbalance between the input and the output, provides in output information which does not depend on the power supply voltage $V_{CC}$, on the operating frequency (in the operating range of audio devices) and on the maximum swing of the output signal.

The circuit provides the requested distortion information immediately, without integrating the output signal, and furthermore does not require the output stage to be provided in a particular manner but can be applied to output stages having different structures.

The presence of the voltage divider $R_3$, $R_4$ allows to preset the percentage of distortion at which the circuit must intervene; said percentage can be adjusted according to the requirements by means of an appropriate choice of the value of the resistors. On this subject, the fact is stressed that if the circuit according to the invention is executed in a discrete manner, the resistor $R_4$ can be actually produced by means of a variable element (potentiometer), whereas if the circuit is integrated, the value of said resistor, which is appropriately chosen according to the requirements prior to the practical execution of the circuit, is subsequently fixed.

The execution of comparators each of which operates on a different half-wave allows separate distortion sensing on the two half-waves and therefore good sensing precision even when non-symmetrical distortion of the stage output signal occurs.

The invention is furthermore circuitally simple and can be easily integrated, so that its manufacturing costs are compatible with the intended application.

The invention thus conceived is susceptible to numerous modifications and variations, all of which are within the scope of the inventive concept.

All the details may furthermore be replaced with other technically equivalent ones.

We claim:

1. Circuit for sensing output distortion of amplifier stages, in particular of final stages of audio devices, said amplifier stage having a first input which receives a voltage signal to be amplified, a second input which is connected to a feedback network and an output which generates an amplified output signal, said circuit further comprising a voltage divider arranged between said first input and a reference voltage line, said voltage divider comprising at least one variable resistor and having an intermediate terminal which generates a first signal which is correlated to said voltage signal, and comparator means which receive in input said first signal and a second signal which is correlated to said output signal, said comparator means being suitable for generating a distortion signal when said second signal exceeds said first signal in terms of absolute value, said comparator means comprising at least one first comparator which is connected in input to said first input of said amplifier stage and to said reference voltage line and is suitable for generating an enable signal which is in step with said voltage signal, and a second comparator which is connected in input to said intermediate terminal of said divider and to the feedback network of said amplifier stage and is suitable for generating said distortion signal in output, said second comparator being enabled by said enable signal.

2. Circuit according to claim 1, wherein said second comparator is connected to said intermediate terminal with its non-inverting input and to said feedback network with its inverting terminal, and in that said first comparator enables said second comparator during the positive half-wave of said voltage signal.

3. Circuit according to claim 2, wherein said comparator means comprise a third comparator which is connected to said intermediate terminal with its inverting input and to said feedback network with its non-inverting input, said third comparator being enabled by said first comparator during the negative half-wave of said voltage signal.

4. Circuit according to claim 3, wherein each of said comparators comprises a differential circuit, each of the differential circuits which define said second and third comparators being connected in output to a respective current mirror circuit enabled by the differential circuit which defines said comparator, each of said current mirror circuits driving a respective transistor of a logic sum circuit.

* * * * *